(12) United States Patent
Miyagi et al.

(10) Patent No.: US 9,142,433 B2
(45) Date of Patent: Sep. 22, 2015

(54) SUBSTRATE PROCESSING APPARATUS AND SUBSTRATE PROCESSING METHOD

(71) Applicants: Masahiro Miyagi, Kyoto (JP); Kazunori Fujikawa, Kyoto (JP)

(72) Inventors: Masahiro Miyagi, Kyoto (JP); Kazunori Fujikawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 13/628,650

(22) Filed: Sep. 27, 2012

(65) Prior Publication Data

US 2013/0084709 A1    Apr. 4, 2013

(30) Foreign Application Priority Data

Sep. 29, 2011  (JP) ................ P2011-215258
Sep. 29, 2011  (JP) ................ P2011-215260

(51) Int. Cl.
*H01L 21/306* (2006.01)
*H01L 21/302* (2006.01)
*B08B 3/08* (2006.01)
*H01L 21/67* (2006.01)

(52) U.S. Cl.
CPC ................ *H01L 21/67028* (2013.01)

(58) Field of Classification Search
USPC ........... 156/345.11, 345.55, 345.17; 134/902
See application file for complete search history.

(56) References Cited

U.S. PATENT DOCUMENTS

| | | | | |
|---|---|---|---|---|
| 5,845,660 | A * | 12/1998 | Shindo et al. | 134/56 R |
| 6,001,191 | A * | 12/1999 | Kamikawa et al. | 134/32 |
| 6,109,278 | A * | 8/2000 | Shindo et al. | 134/56 R |
| 6,128,830 | A * | 10/2000 | Bettcher et al. | 34/404 |
| 6,227,212 | B1 * | 5/2001 | Konishi et al. | 134/1.3 |
| 6,837,941 | B2 * | 1/2005 | Hirooka et al. | 134/2 |
| 2002/0062843 | A1 | 5/2002 | Hirooka et al. | 134/6 |
| 2004/0084301 | A1 * | 5/2004 | Dordi et al. | 204/252 |
| 2009/0211610 | A1 | 8/2009 | Honbe et al. | 134/26 |
| 2011/0089137 | A1 | 4/2011 | Tanaka et al. | 216/13 |
| 2013/0084709 | A1 | 4/2013 | Miyagi et al. | 438/745 |
| 2013/0084710 | A1 * | 4/2013 | Miyagi | 438/745 |
| 2014/0202496 | A1 * | 7/2014 | Miyagi et al. | 134/18 |

FOREIGN PATENT DOCUMENTS

| | | |
|---|---|---|
| JP | S61-268391 | 11/1986 |
| JP | S63-012391 | 1/1988 |
| JP | 03-041729 | 2/1991 |
| JP | 11-026412 | 1/1999 |
| JP | 11-221532 | 8/1999 |
| JP | 2007-227467 | 9/2007 |

(Continued)

*Primary Examiner* — Sylvia R MacArthur
(74) *Attorney, Agent, or Firm* — Ostrolenk Faber LLP

(57) ABSTRACT

In a substrate processing apparatus, an anti-static liquid supply part supplies the anti-static liquid having electrical resistivity higher than that of an SPM liquid onto a substrate to puddle an entire upper surface of the substrate with the anti-static liquid, to thereby gradually remove static electricity from the substrate. Then, the processing liquid supply part supplies the SPM liquid onto the substrate to thereby perform an SPM process. In the SPM process, it is thereby possible to prevent a large amount of electric charges from rapidly moving from the substrate to the SPM liquid and prevent any damage to the substrate. Further, by maintaining the electrical resistivity of the anti-static liquid at the target electrical resistivity, it is possible to increase the static elimination efficiency of the substrate and shorten the time required for the static elimination process within the limits of causing no damage to the substrate.

14 Claims, 6 Drawing Sheets

(56) References Cited

FOREIGN PATENT DOCUMENTS

| JP | 2009-200365 | 9/2009 |
| JP | 2011-103438 | 5/2011 |
| JP | 2011-514684 | 5/2011 |
| JP | 2013-77626 | 4/2013 |
| KR | 10-2008-0034277 | 4/2008 |
| WO | WO 2009/114964 A1 | 9/2009 |

* cited by examiner

SUBSTRATE PROCESSING APPARATUS AND SUBSTRATE PROCESSING METHOD

TECHNICAL FIELD

The present invention relates to a technique for processing a substrate.

BACKGROUND ART

In a process of manufacturing a semiconductor substrate (hereinafter, referred to simply as a "substrate"), conventionally, various processes are performed on a substrate having an insulating film such as an oxide film or the like thereon by using a substrate processing apparatus. By supplying a processing liquid onto a substrate having a surface on which a resist pattern is formed, for example, a process such as etching or the like is performed on the surface of the substrate. Further, after etching or the like is finished, a process of removing the resist from the substrate is also performed.

In a substrate processing apparatus disclosed in Japanese Patent Application Laid-Open No. 2009-200365, before the process using a processing liquid such as an SPM (sulfuric acid/hydrogen peroxide mixture) liquid or the like is performed, a liquid having electrical conductivity lower than the processing liquid is supplied to a processing area on a substrate and then the processing liquid is discharged to the processing area with the liquid existing therein. It is thereby possible, in the substrate processing apparatus, to prevent any local damage of the substrate due to the contact made between the substrate and the processing liquid. The local damage of the substrate refers to destruction of a field oxide film or a gate oxide film in the processing area, and the destruction is caused by bringing the processing area on the substrate into contact with the processing liquid which is electrically charged by the frictional electrification phenomenon between the processing liquid and a processing liquid nozzle.

A substrate to be processed by a substrate processing apparatus is subjected to a drying process such as dry etching, plasma CVD (Chemical Vapor Deposition), or the like, before being loaded into the substrate processing apparatus. In such a drying process, since electric charges are generated in a device, the substrate which is electrically charged is loaded into the substrate processing apparatus. Then, in the substrate processing apparatus, when a processing liquid having low electrical resistivity, such as an SPM liquid, is supplied onto the substrate, the electric charges in the device rapidly move from the device to the processing liquid (in other words, the electric charges are discharged into the processing liquid) and damage may be caused in the device by heat generation due to the movement of the electric charges. Then, it is thought to be effective to remove static electricity from the substrate by using an ionizer before supplying the processing liquid onto the substrate, but when the amount of electrostatic charges on the substrate is too large, it is hard to efficiently remove static electricity from the substrate.

On the other hand, in the substrate processing apparatus disclosed in Japanese Patent Application Laid-Open No. 2009-200365, if water is contained in the liquid to be supplied onto the substrate before the process using the processing liquid is performed, for example, in the process using the processing liquid, damage may be caused to the substrate by heat of reaction between sulfuric acid in the SPM liquid serving as the processing liquid and water. Further, if water-diluted processing liquid is used, the processing liquid, when supplied onto the substrate, may deteriorate the quality of the processing of the substrate. When the water-diluted processing liquid is partial mixture of the processing liquid and water, the liquid leads to ununiformity in the concentration of the processing liquid, which may deteriorate uniformity of the processing over the entire substrate.

SUMMARY OF INVENTION

The present invention is intended for a substrate processing apparatus for processing a substrate, and it is an object of the present invention to prevent any damage to the substrate due to the movement of the electric charges in a process using a processing liquid. It is another object of the present invention to prevent any adverse effect of mixture of the processing liquid and other liquid.

The substrate processing apparatus according to the present invention comprises a substrate holding part for holding a substrate with a main surface thereof directed upward, a processing liquid supply part for supplying a processing liquid onto the main surface of the substrate, an anti-static liquid supply part for supplying an ionic liquid or deionized water onto the main surface of the substrate as an anti-static liquid having electrical resistivity higher than that of the processing liquid, an electrical resistivity setting part for setting target electrical resistivity of the anti-static liquid, and a control part for controlling the processing liquid supply part and the anti-static liquid supply part to supply the anti-static liquid onto the main surface of the substrate to thereby puddle entire the main surface of the substrate with the anti-static liquid while controlling the ion concentration of the anti-static liquid to maintain the electrical resistivity of the anti-static liquid at the target electrical resistivity, and to then supply the processing liquid onto the main surface of the substrate to thereby perform a process. By the present invention, it is possible to prevent any damage to the substrate due to the movement of the electric charges in the process using the processing liquid.

In one preferred embodiment of the present invention, the target electrical resistivity set in the electrical resistivity setting part becomes higher as the size of a device formed on the substrate in advance becomes smaller.

In another preferred embodiment of the present invention, the electrical resistivity setting part sets the target electrical resistivity on the basis of the kind of process performed on the substrate.

In still another preferred embodiment of the present invention, the processing liquid is an SPM liquid in which sulfuric acid which is heated and hydrogen peroxide water are mixed, and the process is an SPM process.

In still another preferred embodiment of the present invention, the processing liquid is a buffered hydrofluoric acid, and the process is an etching process.

In still another preferred embodiment of the present invention, the anti-static liquid is the ionic liquid, and the ionic liquid is a solution in which carbon dioxide is dissolved in deionized water. More preferably, said control part controls the amount of carbon dioxide to be dissolved in said deionized water to thereby maintain electrical resistivity of said anti-static liquid at said target electrical resistivity.

The substrate processing apparatus according to one aspect of the present invention comprises a substrate holding part for holding a substrate with a main surface thereof directed upward, a processing liquid supply part for supplying a processing liquid onto the main surface of the substrate, an anti-static liquid supply part for supplying an anti-static liquid having electrical resistivity higher than that of the processing liquid onto the main surface of the substrate, a liquid removing part for removing a liquid from the main surface of the substrate, and a control part for controlling the processing liquid supply part, the anti-static liquid supply part, and the liquid removing part to supply the anti-static liquid onto the main surface of the substrate to thereby puddle entire the main surface of the substrate with the anti-static liquid, and to then remove the anti-static liquid from the main surface and further supply the processing liquid onto the main surface of the substrate to thereby perform a process. It is thereby possible to prevent any damage to the substrate due to the movement of the electric charges in the process using the processing liquid. It is further possible to prevent any adverse effect of the mixture of the processing liquid and other liquid.

In one preferred embodiment of the present invention, the liquid removing part comprises a substrate rotating mechanism for rotating the substrate together with the substrate holding part about a rotation axis which goes through a center of the substrate and is perpendicular to the main surface of the substrate to thereby remove a liquid from the main surface. More preferably, a puddle process is performed on entire the main surface of the substrate with the anti-static liquid while the substrate rotating mechanism stops or rotates the substrate at a rotating speed lower than that of the substrate in removing the liquid from the main surface.

In another preferred embodiment of the present invention, the liquid removing part comprises an IPA supply part for supplying liquid isopropyl alcohol onto the main surface of the substrate to push a liquid on the main surface out of an edge of the substrate, to thereby remove the liquid from the main surface of the substrate.

The present invention is also intended for a substrate processing method of processing a substrate.

These and other objects, features, aspects and advantages of the present invention will become more apparent from the following detailed description of the present invention when taken in conjunction with the accompanying drawings.

DESCRIPTION OF EMBODIMENTS

Figure 1:
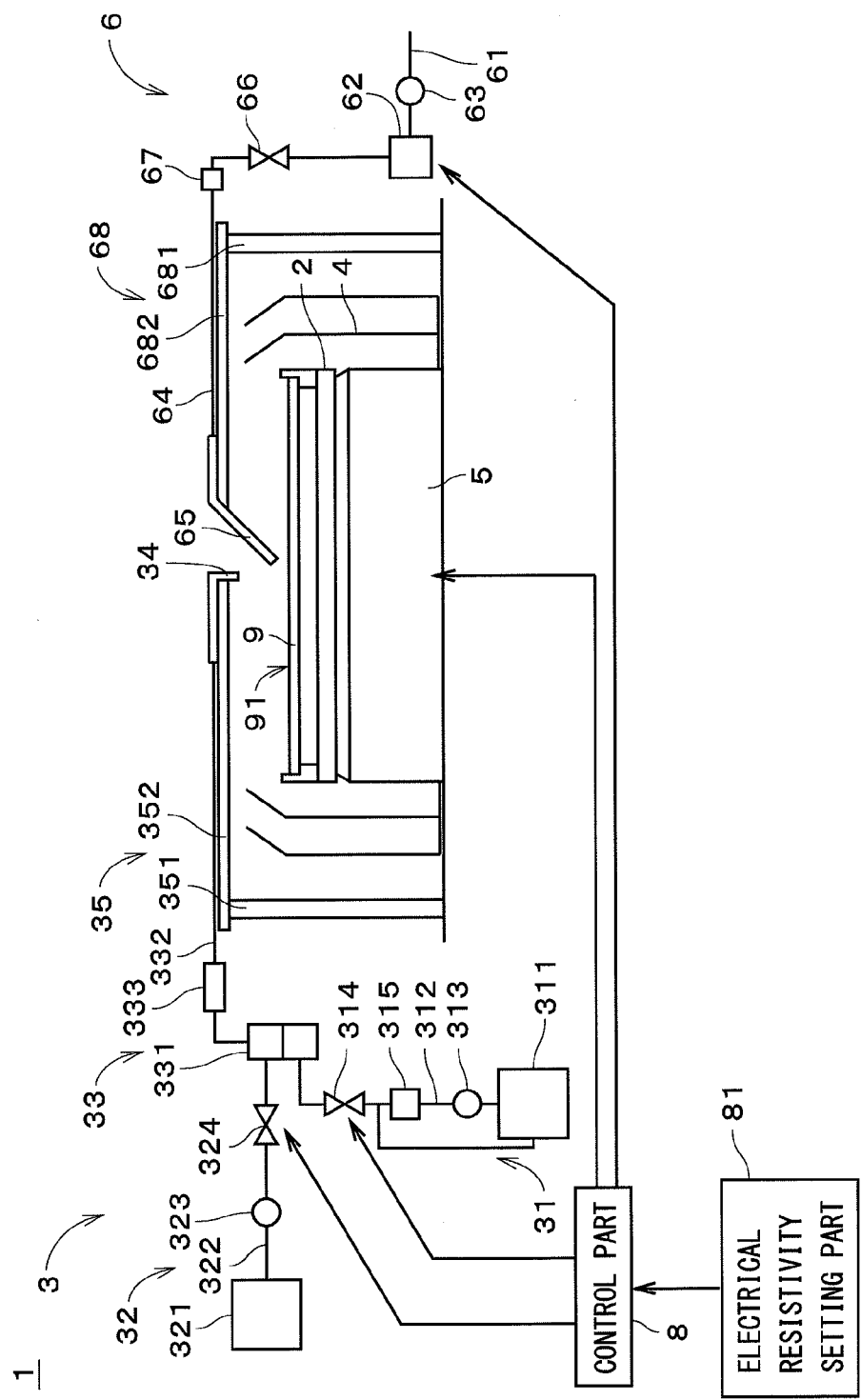
FIG. 1 is a view showing a configuration of a substrate processing apparatus in accordance with a first preferred embodiment of the present invention.

FIG. 1 is a view showing a configuration of a substrate processing apparatus 1 in accordance with the first preferred embodiment of the present invention. As shown in FIG. 1, the substrate processing apparatus 1 is a single-substrate processing apparatus for processing semiconductor substrates 9 (hereinafter, referred to simply as "substrates 9") one by one. In the substrate processing apparatus 1, an SPM (sulfuric acid/hydrogen peroxide mixture) liquid is supplied onto the substrate 9, to thereby perform an SPM process, i.e., a process of removing a resist film from the substrate 9.

The substrate processing apparatus 1 comprises a substrate holding part 2 for holding a substrate 9 with one main surface 91 (hereinafter, referred to as an "upper surface 91") thereof directed upward, a processing liquid supply part 3 for discharging a liquid such as an SPM liquid or the like toward the upper surface 91 of the substrate 9, a cup part 4 surrounding the periphery of the substrate 9 and the substrate holding part 2, a substrate rotating mechanism 5 for horizontally rotating the substrate 9 together with the substrate holding part 2, an anti-static liquid supply part 6 for supplying an anti-static liquid onto the upper surface 91 of the substrate 9, an electrical resistivity setting part 81 for setting target electrical resistivity of the anti-static liquid, and a control part 8 for controlling these mechanisms. The substrate holding part 2 holds the substrate 9 in a way such that a plane-normal of the upper surface 91 directs upward. The substrate 9 is rotated together with the substrate holding part 2 by the substrate rotating mechanism 5 about a rotation axis which goes through a center of the substrate 9 and is perpendicular to the upper surface 91 of the substrate 9. The electrical resistivity setting part 81 is connected to the control part 8. In the substrate processing apparatus 1, the substrate holding part 2, the cup part 4, the substrate rotating mechanism 5, and the like are accommodated in a not-shown chamber.

The processing liquid supply part 3 comprises a sulfuric acid supply part 31 for supplying sulfuric acid, a hydrogen peroxide water supply part 32 for supplying hydrogen peroxide water, a mixture generation part 33 connected to the sulfuric acid supply part 31 and the hydrogen peroxide water supply part 32, a processing liquid nozzle 34 disposed above the substrate 9, for discharging a liquid toward the substrate 9, and a processing liquid nozzle rotating mechanism 35 for horizontally rotating the processing liquid nozzle 34 about a rotation axis 351. The processing liquid nozzle rotating mechanism 35 comprises an arm 352 horizontally extending from the rotation axis 351, to which the processing liquid nozzle 34 is attached.

The sulfuric acid supply part 31 comprises a sulfuric acid storage part 311 for storing sulfuric acid therein, a sulfuric acid pipe 312 connected to the sulfuric acid storage part 311 and the mixture generation part 33, a sulfuric acid pump 313 for supplying the sulfuric acid from the sulfuric acid storage part 311 to the mixture generation part 33 through the sulfuric acid pipe 312, a sulfuric acid valve 314 provided on the sulfuric acid pipe 312, and a sulfuric acid heating part 315 provided on the sulfuric acid pipe 312 between the sulfuric acid pump 313 and the sulfuric acid valve 314, for heating the sulfuric acid. The sulfuric acid pipe 312 branches between the sulfuric acid heating part 315 and the sulfuric acid valve 314, being connected to the sulfuric acid storage part 311, and when the sulfuric acid valve 314 is closed, the sulfuric acid heated by the sulfuric acid heating part 315 circulates between the sulfuric acid storage part 311 and the sulfuric acid heating part 315.

The hydrogen peroxide water supply part 32 comprises a hydrogen peroxide water storage part 321 for storing hydrogen peroxide water therein, a hydrogen peroxide water pipe 322 connected to the hydrogen peroxide water storage part 321 and the mixture generation part 33, a hydrogen peroxide water pump 323 for supplying the hydrogen peroxide water from the hydrogen peroxide water storage part 321 to the mixture generation part 33 through the hydrogen peroxide water pipe 322, and a hydrogen peroxide water valve 324 provided on the hydrogen peroxide water pipe 322. The sulfuric acid storage part 311 and the hydrogen peroxide water storage part 321 may be provided outside the substrate processing apparatus 1, being connected to the sulfuric acid supply part 31 and the hydrogen peroxide water supply part 32, respectively.

The mixture generation part 33 comprises a mixing valve 331 to which the sulfuric acid pipe 312 and the hydrogen peroxide water pipe 322 are connected, a discharging pipe 332 connected to the mixing valve 331 and the processing liquid nozzle 34, and an mixing flow tube 333 provided on the discharging pipe 332. In the mixture generation part 33, the heated sulfuric acid supplied from the sulfuric acid supply part 31 and the hydrogen peroxide water of ordinary temperature (almost the same temperature as the room temperature) supplied from the hydrogen peroxide water supply part 32 are mixed in the mixing valve 331, to thereby generate an SPM liquid. The SPM liquid goes through the mixing flow tube 333 and the discharging pipe 332 and is transferred to the processing liquid nozzle 34. In the mixing flow tube 333, the SPM liquid is agitated to accelerate the chemical reaction of the sulfuric acid and the hydrogen peroxide water. The SPM liquid serving as a processing liquid is discharged from an outlet at the front end of the processing liquid nozzle 34 toward the upper surface 91 of the substrate 9. In the first preferred embodiment, the sulfuric acid heated to about 130° C. to 150° C. by the sulfuric acid heating part 315 is supplied from the sulfuric acid supply part 31 to the mixture generation part 33. The temperature of the sulfuric acid to be supplied from the sulfuric acid supply part 31 may be changed as appropriate.

The anti-static liquid supply part 6 supplies an ionic liquid or deionized water (DIW) onto the upper surface 91 of the substrate 9 as an anti-static liquid having electrical resistivity higher than that of the SPM liquid serving as a processing liquid. In the first preferred embodiment, as the ionic liquid, used is a solution in which carbon dioxide ($CO_2$) is dissolved in deionized water. The anti-static liquid supply part 6 comprises a deionized water pipe 61 connected to a not-shown deionized water supply part, a carbon dioxide dissolution unit 62 connected to the deionized water pipe 61, a flowmeter 63 provided on the deionized water pipe 61, for measuring the amount of flow of deionized water, an anti-static liquid pipe 64 connected to the carbon dioxide dissolution unit 62, an anti-static liquid nozzle 65 provided at the front end of the anti-static liquid pipe 64, an anti-static liquid valve 66 provided on the anti-static liquid pipe 64, an electrical resistivity meter 67 provided on the anti-static liquid pipe 64 between the anti-static liquid valve 66 and the anti-static liquid nozzle 65, and an anti-static liquid nozzle rotating mechanism 68 for horizontally rotating the anti-static liquid nozzle 65 about a rotation axis 681. The anti-static liquid nozzle rotating mechanism 68 comprises an arm 682 horizontally extending from the rotation axis 681, to which the anti-static liquid nozzle 65 is attached.

The outlet at the front end of the anti-static liquid nozzle 65 is positioned above a center portion of the upper surface 91 of the substrate 9. The electrical resistivity meter 67 measures the electrical resistivity of the anti-static liquid flowing in the anti-static liquid pipe 64. An output from the electrical resistivity meter 67 is sent to the control part 8. The target electrical resistivity of the anti-static liquid which is set by the electrical resistivity setting part 81, i.e., desirable electrical resistivity of the anti-static liquid in a static elimination process discussed later is sent to the control part 8 and stored therein in advance. The electrical resistivity setting part 81 stores a table indicating a relation between a size of a device formed on the substrate 9 in advance and target electrical resistivity of the anti-static liquid, and when a size of the device is inputted to the electrical resistivity setting part 81, the target electrical resistivity is set on the basis of the size and the table. In the electrical resistivity setting part 81, the smaller the size of the device formed on the substrate 9 in advance is (in other words, the smaller the minimum width of a wire of the device is), the larger the target electrical resistivity is set. In the first preferred embodiment, the target electrical resistivity is set in a range from 0.05 to 18 MΩ·cm (megaohm-cm). When the target electrical resistivity is 18 MΩ·cm, carbon dioxide is not dissolved in the deionized water from the deionized water pipe 61 in the carbon dioxide dissolution unit 62, and the deionized water is supplied onto the substrate 9 as the anti-static liquid from the anti-static liquid nozzle 65.

In the substrate processing apparatus 1, the carbon dioxide dissolution unit 62 of the anti-static liquid supply part 6 is feedback controlled by the control part 8 on the basis of the output from the electrical resistivity meter 67 (i.e., a measured value of the electrical resistivity of the anti-static liquid in the anti-static liquid pipe 64) and the above-described target electrical resistivity, and the amount of carbon dioxide to be dissolved in the deionized water from the deionized water pipe 61 is thereby controlled. In other words, the ion concentration of the anti-static liquid transferred from the carbon dioxide dissolution unit 62 to the anti-static liquid pipe 64 is controlled. The electrical resistivity of the anti-static liquid is thereby maintained at the target electrical resistivity. In more detail, by the above-discussed feedback control, the electrical resistivity of the anti-static liquid is maintained within a narrow range of the electrical resistivity which is substantially equal to the target electrical resistivity (as a matter of course, including the target electrical resistivity).

Figure 2:
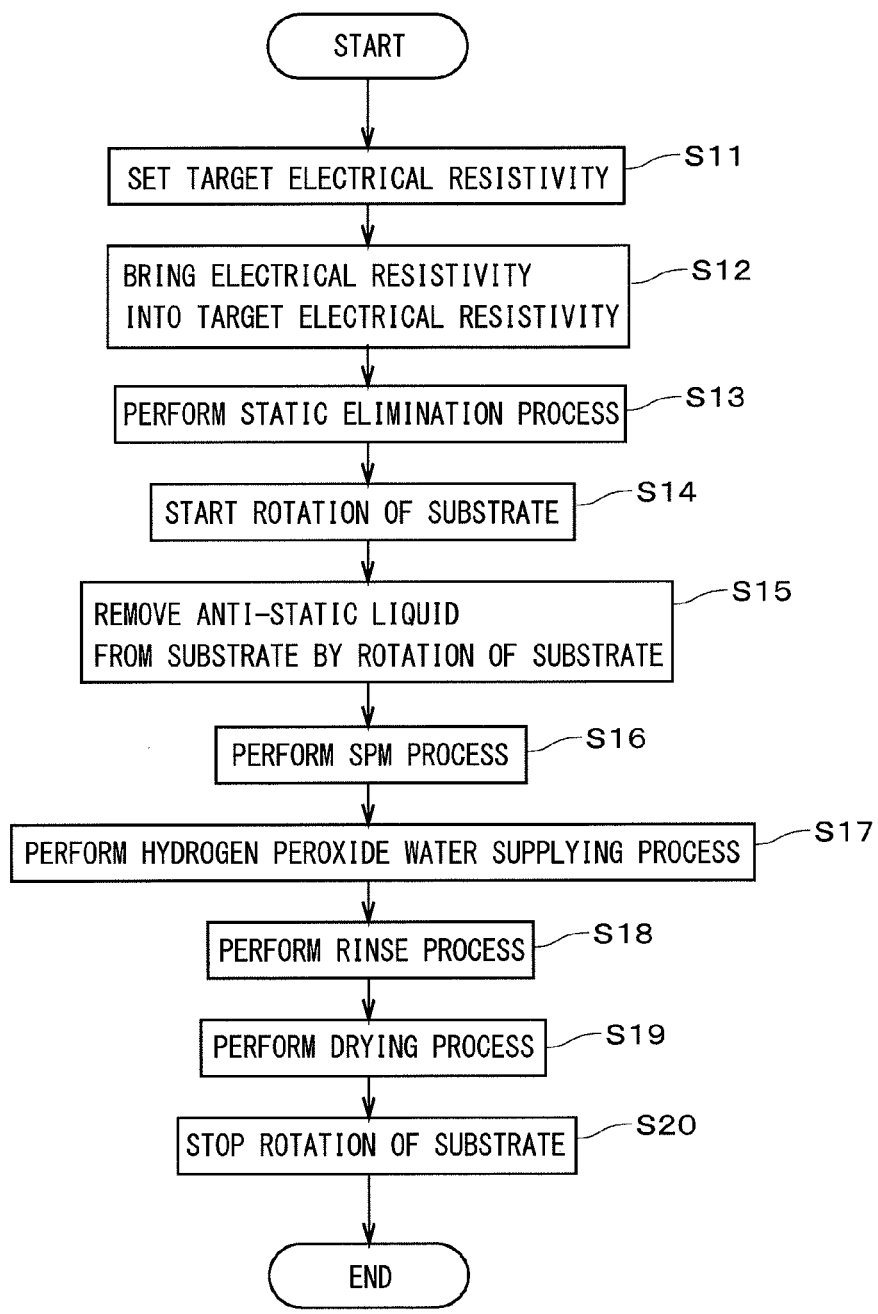
FIG. 2 is a flowchart showing an operation flow for processing a substrate.

FIG. 2 is a flowchart showing an operation flow for processing the substrate 9 in the substrate processing apparatus 1. In the substrate processing apparatus 1, first, the substrate 9 is loaded thereinto and held by the substrate holding part 2. Before being loaded into the substrate processing apparatus 1, the substrate 9 is subjected to a drying process such as dry etching, plasma CVD (Chemical Vapor Deposition), or the like, and the substrate 9 is thereby electrically charged.

Subsequently, on the basis of the size of the device on the substrate 9 which is inputted in advance, the target electrical resistivity of the anti-static liquid is set by the electrical resistivity setting part 81 and stored in the control part 8 (Step S11). In the anti-static liquid supply part 6, with the anti-static liquid nozzle 65 positioned at a waiting position outside the substrate 9, the control part 8 opens the anti-static liquid valve 66 and the anti-static liquid nozzle 65 starts discharge of the anti-static liquid. Then, the feedback control is performed on the basis of the output from the electrical resistivity meter 67 and the target electrical resistivity, and the ion concentration of the anti-static liquid is controlled, to thereby bring the electrical resistivity of the anti-static liquid into the target electrical resistivity (Step S12).

Next, by the anti-static liquid nozzle rotating mechanism 68, the anti-static liquid nozzle 65 is moved from the waiting position, and as shown in FIG. 1, the outlet at the front end of the anti-static liquid nozzle 65 is directed to the center portion of the upper surface 91 of the substrate 9. At that time, the substrate rotating mechanism 5 is controlled by the control part 8 to stop or rotate at a small number of revolutions, and therefore the substrate 9 is not rotated or is rotated at a small number of revolutions (e.g., 10 to 200 rpm). Then, after a predetermined amount of anti-static liquid is supplied onto the upper surface 91 of the substrate 9 from the anti-static liquid nozzle 65, the supply of the anti-static liquid from the anti-static liquid nozzle 65 is stopped. The anti-static liquid supplied from the anti-static liquid nozzle 65 spreads from the center portion of the substrate 9 over the entire upper surface 91, and a thin film of the anti-static liquid (having a thickness of e.g., about 1 mm) is thereby formed on the entire upper surface 91 and the entire upper surface 91 is puddled with the anti-static liquid. With this thin film formation, the electric charges on the substrate 9 are relatively gently moved to the anti-static liquid and the static elimination process is thus performed (in other words, a puddle process is performed with the anti-static liquid) on the entire upper surface 91 of the substrate 9 (Step S13). The puddle process with the anti-static liquid is performed by maintaining a state in which the entire upper surface 91 of the substrate 9 is puddled with the anti-static liquid for a predetermined time period while the substrate rotating mechanism 5 stops or rotates at a small number of revolutions (e.g., 10 to 200 rpm).

Figure 3A:
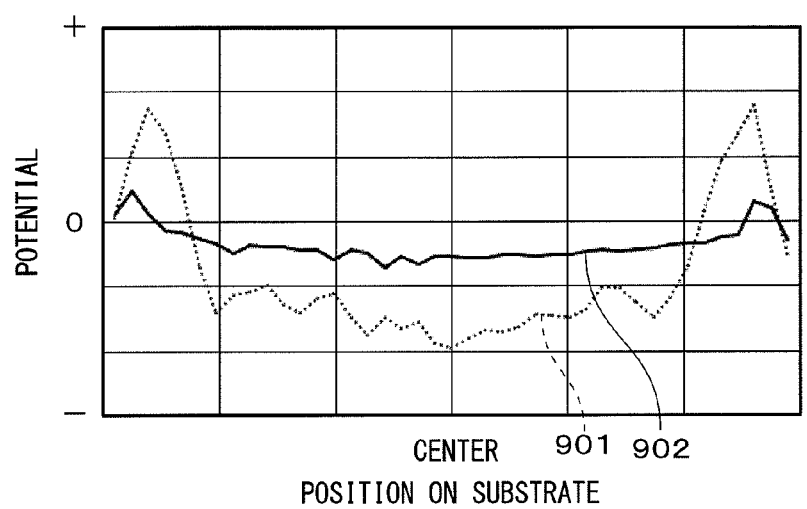
FIGS. 3A and 3B are graphs each showing surface potential distributions on the substrate before and after a static elimination process.
Figure 3B:
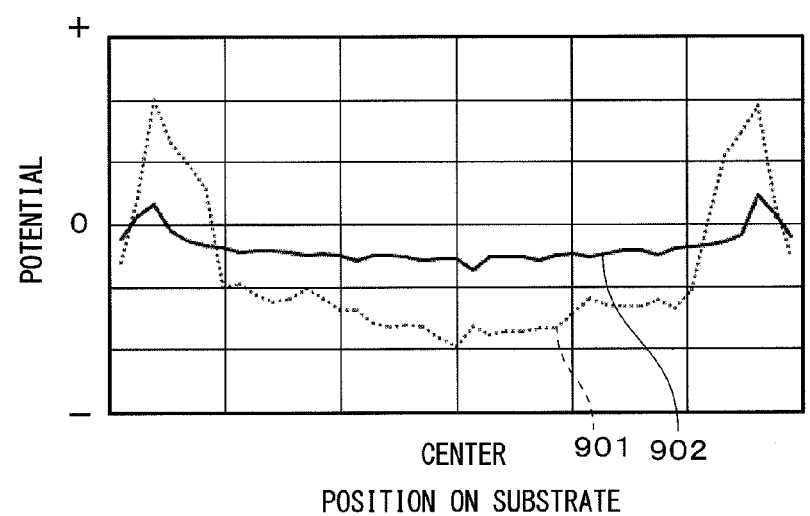

FIGS. 3A and 3B are graphs each showing surface potential distributions on the substrate 9 before and after the static elimination process. FIG. 3A shows surface potential distributions on one diameter of the substrate 9, and FIG. 3B shows surface potential distributions on one diameter orthogonal to that in FIG. 3A. In FIGS. 3A and 3B, the horizontal axis represents a position on the diameter of the substrate 9 and the vertical axis represents a potential at the position. The broken line 901 indicates the potential distribution before the static elimination process and the solid line 902 indicates the potential distribution after the static elimination process. The same description as that on FIGS. 3A and 3B applies to FIGS. 4A and 4B.

FIGS. 3A and 3B show the potential distributions on the substrate 9 in a case where deionized water is used as the anti-static liquid since the size of the device formed on the substrate 9 is too small. As shown in FIGS. 3A and 3B, by performing the above-discussed static elimination process using deionized water as the anti-static liquid, the amount of electric charges on the substrate 9 decreases and the potential of the substrate 9 is reduced on the whole.

Figure 4A:
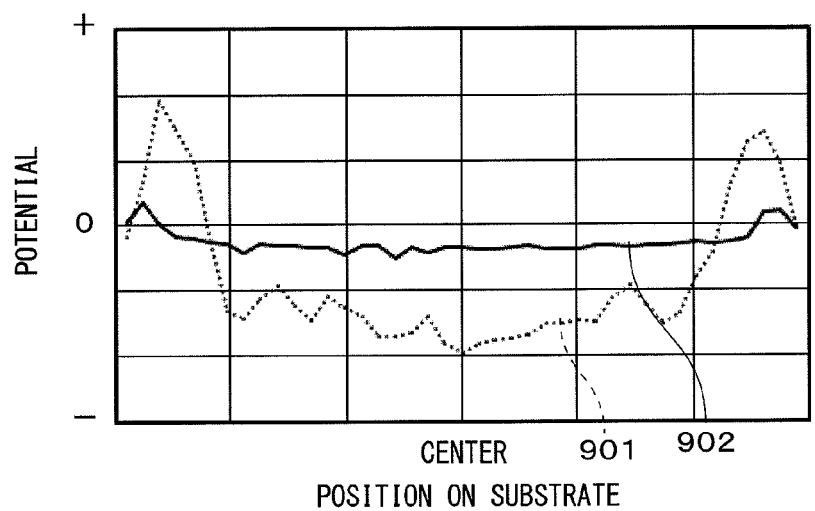
FIGS. 4A and 4B are graphs each showing surface potential distributions on the substrate before and after the static elimination process.
Figure 4B:
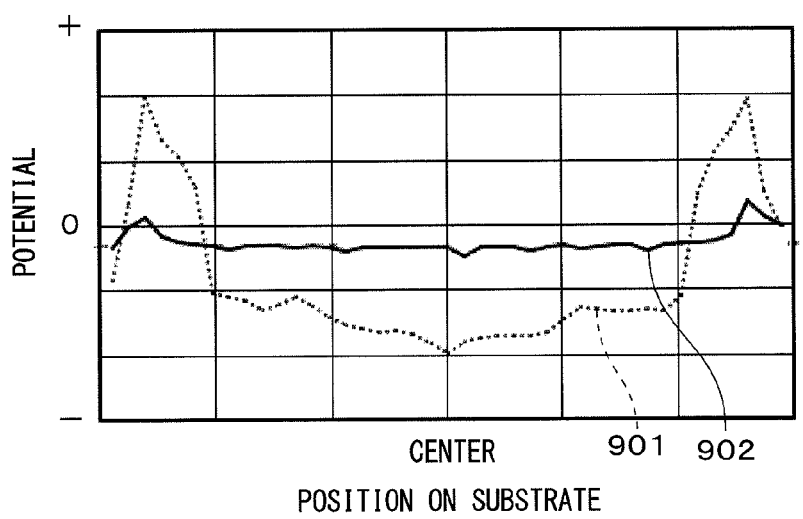

FIGS. 4A and 4B are graphs each showing surface potential distributions on the substrate 9 before and after the static elimination process on the substrate 9 on which a device having a relatively large size is formed (in other words, the substrate 9 has relatively high resistance to damage due to the movement of the electric charges). In cases of FIGS. 4A and 4B, carbon dioxide water in which carbon dioxide is dissolved in deionized water so that the electrical resistivity may become the target electrical resistivity set by the electrical resistivity setting part 81 is used as the anti-static liquid. As shown in FIGS. 4A and 4B, by performing the above-discussed static elimination process using the carbon dioxide water as the anti-static liquid, the amount of electric charges on the substrate 9 decreases and the potential of the substrate 9 is reduced on the whole. By using the carbon dioxide water having electrical resistivity lower than that of deionized water as the anti-static liquid, the time required for the static elimination process can be reduced.

After the static elimination process on the substrate 9 is finished, the anti-static liquid nozzle rotating mechanism 68 moves the anti-static liquid nozzle 65 back to the waiting position. Subsequently, the control part 8 controls the substrate rotating mechanism 5 to start rotation of the substrate 9 (Step S14). When the above-discussed static elimination process is performed while the substrate 9 is rotated at a low speed, the rotating speed of the substrate 9 is increased. Then, with the rotation of the substrate 9, the anti-static liquid on the upper surface 91 of the substrate 9 is moved toward an edge of the substrate 9 and scattered out of the edge of the substrate 9, to be thereby removed from the substrate 9 (Step S15). The anti-static liquid scattered out of the substrate 9 is received by the cup part 4. In the substrate processing apparatus 1, the substrate rotating mechanism 5 serves as a liquid removing part for removing the liquid from the upper surface 91 by rotating the substrate 9.

After the removal of the anti-static liquid is finished, the rotating speed of the substrate 9 by the substrate rotating mechanism 5 is decreased to the rotating speed in the SPM process. Further, the processing liquid nozzle rotating mechanism 35 starts rotation of the processing liquid nozzle 34 and the processing liquid nozzle 34 thereby repeats reciprocating motion between the center portion of the substrate 9 and the edge thereof.

Next, the control part 8 controls the processing liquid supply part 3 to open the sulfuric acid valve 314 of the sulfuric acid supply part 31 and the sulfuric acid heated by the sulfuric acid heating part 315 up to about 130 to 150° C. is thereby supplied to the mixture generation part 33 through the sulfuric acid pipe 312. Further, the control part 8 opens the hydrogen peroxide water valve 324 and the hydrogen peroxide water of room temperature is thereby supplied from the hydrogen peroxide water storage part 321 to the mixing valve 331 through the hydrogen peroxide water pipe 322. In the mixing valve 331, the heated sulfuric acid and the hydrogen peroxide water of room temperature are mixed to generate the SPM liquid. The temperature of the SPM liquid becomes, e.g., about 150 to 195° C. which is higher than the temperature of the sulfuric acid supplied from the sulfuric acid supply part 31, by the reaction of the sulfuric acid and the hydrogen peroxide water.

The SPM liquid goes through the discharging pipe 332 and the mixing flow tube 333 and is supplied from the processing liquid nozzle 34 onto the upper surface 91 of the substrate 9. In other words, the processing liquid supply part 3 supplies the heated sulfuric acid and the hydrogen peroxide water while being mixed, onto the upper surface 91 of the substrate 9. With the rotation of the substrate 9, the SPM liquid spreads over the entire upper surface 91 of the substrate 9 and is scattered out of the edge of the substrate 9 and received by the cup part 4. In the substrate processing apparatus 1, the SPM liquid is continuously supplied onto the substrate 9 for a predetermined time period, and the SPM process for the substrate 9, i.e., a process of removing the resist film on the substrate 9 with a strong oxidizing power of Caro's acid contained in the SPM liquid is performed (Step S16). Further, in the substrate processing apparatus 1, the SPM liquid or the like may be supplied from the processing liquid nozzle 34 which stays still above the center portion of the substrate 9.

After the SPM process is finished, the sulfuric acid valve 314 is closed while the hydrogen peroxide water valve 324 remains open, and the hydrogen peroxide water goes through the mixing valve 331, the discharging pipe 332, and the mixing flow tube 333 and is supplied from the processing liquid nozzle 34 onto the substrate 9 from which the resist film is removed (Step S17). By performing the hydrogen peroxide water supplying process, the SPM liquid which remains in the mixing valve 331, the discharging pipe 332, the mixing flow tube 333, and the processing liquid nozzle 34 is removed. With the rotation of the substrate 9, the hydrogen peroxide water supplied onto the substrate 9 spreads over the entire upper surface 91 of the substrate 9 and the SPM liquid remaining on the substrate 9 is pushed out of the edge of the substrate 9 and removed therefrom.

After the hydrogen peroxide water supplying process is finished, the hydrogen peroxide water valve 324 is closed to stop the supply of the hydrogen peroxide water, and the processing liquid nozzle rotating mechanism 35 moves the processing liquid nozzle 34 to the waiting position outside the substrate 9. Next, a rinse process is performed, in which a rinse liquid is supplied onto the upper surface 91 of the substrate 9 (Step S18). As the rinse liquid, deionized water is used. The rinse liquid may be supplied from a not-shown rinse liquid supply part or supplied by the anti-static liquid supply part 6. With the rotation of the substrate 9, the rinse liquid spreads over the entire upper surface 91 of the substrate 9. The hydrogen peroxide water remaining on the substrate 9 is thereby rinsed. After the rinse process is continuously performed for a predetermined time period, the supply of the rinse liquid is stopped. Then, the rotating speed of the substrate 9 is increased, and a drying process for removing the rinse liquid remaining on the substrate 9 with the rotation of the substrate 9 is performed (Step S19). After that, the rotation of the substrate 9 is stopped (Step S20), and the substrate 9 is unloaded from the substrate processing apparatus 1.

Thus, in the substrate processing apparatus 1, before the SPM process using the SPM liquid is performed, the anti-static liquid having electrical resistivity higher than that of the SPM liquid is supplied onto the substrate 9 which is electrically charged by the preprocess such as dry etching, plasma CVD, or the like and the entire upper surface 91 of the substrate 9 is puddled with the anti-static liquid. From the entire upper surface 91 of the substrate 9, static electricity is thereby relatively gently removed. Since there arises no heat generation due to rapid movement of the electric charges from the substrate 9 to the anti-static liquid in the static elimination, it is possible to prevent any damage to the device formed on the substrate 9.

Then, since the SPM liquid is supplied onto the substrate 9 from which static electricity is removed, there arises no rapid movement of a large amount of electric charges from the substrate 9 to the SPM liquid even when the substrate 9 is brought into contact with the SPM liquid having electrical resistivity lower than that of the anti-static liquid, and it is therefore possible to prevent any damage to the device due to the movement of the electric charges, i.e., any damage to the substrate 9 also in the SPM process using the SPM liquid. Further, by controlling the anti-static liquid supply part 6 to maintain the electrical resistivity of the anti-static liquid at the target electrical resistivity, it is possible to increase the static elimination efficiency of the substrate 9 and shorten the time required for the static elimination process within the limits of causing no damage to the substrate 9.

In the substrate processing apparatus 1, since the electrical resistivity setting part 81 sets larger target electrical resistivity as the size of the device formed on the substrate 9 becomes smaller, both preventing any damage to the substrate 9 in the SPM process and shortening the time required for the static elimination process can be achieved compatibly in accordance with the size of the device. Further, by controlling the amount of carbon dioxide to be dissolved in deionized water in the carbon dioxide dissolution unit 62, it is possible to easily control the electrical resistivity of the anti-static liquid.

As discussed above, in the substrate processing apparatus 1, after the static elimination process using the anti-static liquid is performed and the anti-static liquid is removed from the upper surface 91 of the substrate 9, the SPM liquid is supplied onto the substrate 9 to perform the SPM process. It is thereby possible to prevent any adverse effect of the mixture of the anti-static liquid and the SPM liquid. As the adverse effects, there are, for example, damage (so-call heat shock) to the substrate 9 due to the heat of reaction between water in the anti-static liquid and the sulfuric acid in the SPM liquid, deterioration in the quality of the SPM process due to the dilution of the SPM liquid with the anti-static liquid, and deterioration in the uniformity of the SPM process over the entire substrate 9 due to the ununiformity in the concentration of the SPM liquid which is caused by the partial mixture of the SPM liquid and the anti-static liquid.

In the substrate processing apparatus 1, with the rotation of the substrate 9 by the substrate rotating mechanism 5, it is possible to easily remove the anti-static liquid from the substrate 9. Further, since the anti-static liquid can be removed from the substrate 9 in Step S15 by using the substrate rotating mechanism 5 used for rotating the substrate 9 in the SPM process, it is possible to simplify the constitution of the substrate processing apparatus 1. Furthermore, since the static elimination process on the substrate 9 is performed while the substrate rotating mechanism 5 stops or rotates at a low speed, the static elimination of the substrate 9 can be performed with high efficiency. The state in which the substrate rotating mechanism 5 rotates a substrate at a low speed refers to, for example, a state in which the substrate rotating mechanism 5 rotates the substrate 9 at 10 to 200 rpm and the rotation produces no substantial effect on a layer of the anti-static liquid on the substrate 9.

Figure 5:
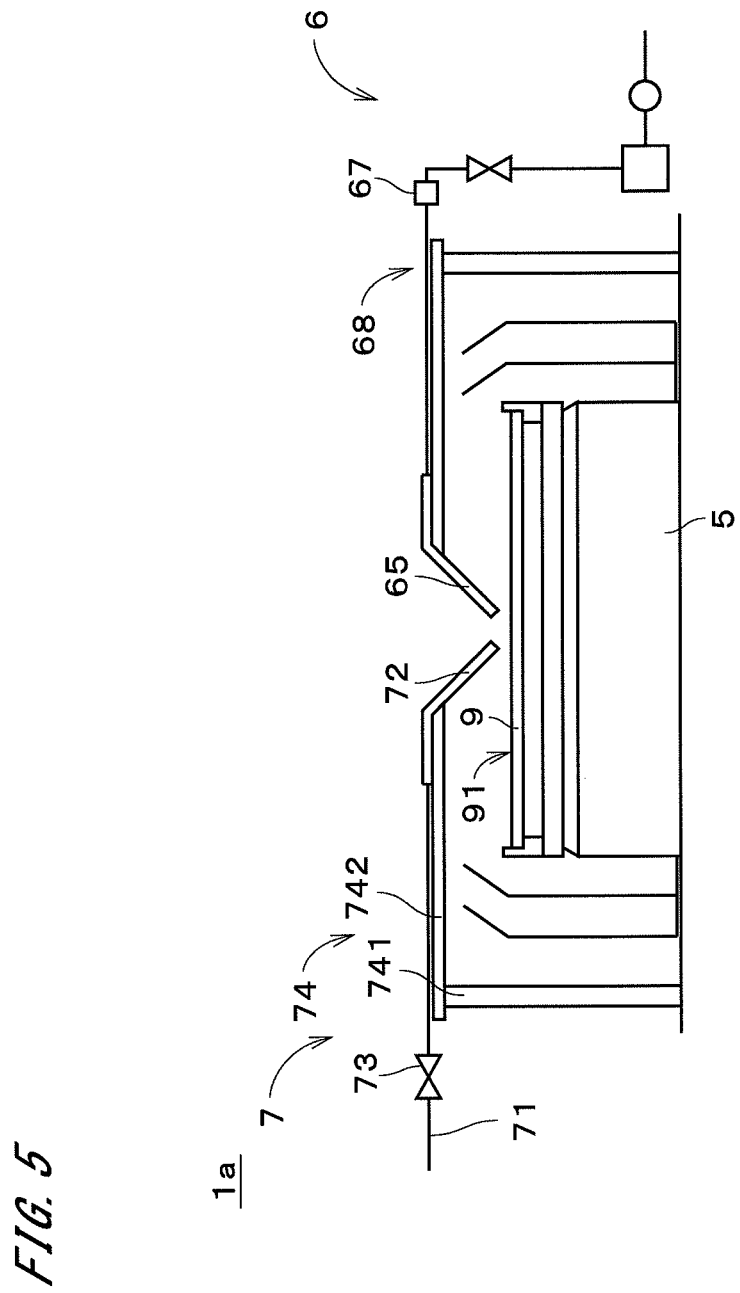
FIG. 5 is a view showing a configuration of a substrate processing apparatus in accordance with a second preferred embodiment of the present invention.

Next, discussion will be made on a second preferred embodiment of the present invention. FIG. 5 is a view showing a configuration of a substrate processing apparatus 1a in accordance with the second preferred embodiment of the present invention. The substrate processing apparatus 1a further comprises an IPA supply part 7 for supplying liquid isopropyl alcohol (hereinafter, referred to as "IPA") onto the upper surface 91 of the substrate 9. The constituent elements other than the above are identical to those in the substrate processing apparatus 1 of FIG. 1 and the corresponding elements are represented by the same reference signs in the following discussion. Though the processing liquid supply part 3 is omitted in FIG. 5 for convenience of illustration, the constitution of the processing liquid supply part 3 is the same as that in the substrate processing apparatus 1 of FIG. 1. Further, in FIG. 5, the control part 8 and the electrical resistivity setting part 81 are also omitted.

The IPA supply part 7 comprises an IPA pipe 71 connected to a not-shown IPA storage part, an IPA nozzle 72 connected to a front end of the IPA pipe 71, an IPA valve 73 provided on the IPA pipe 71, and an IPA nozzle rotating mechanism 74 for horizontally rotating the IPA nozzle 72 about a rotation axis 741. The IPA nozzle rotating mechanism 74 comprises an arm 742 horizontally extending from the rotation axis 741, to which the IPA nozzle 72 is attached.

Figure 6:
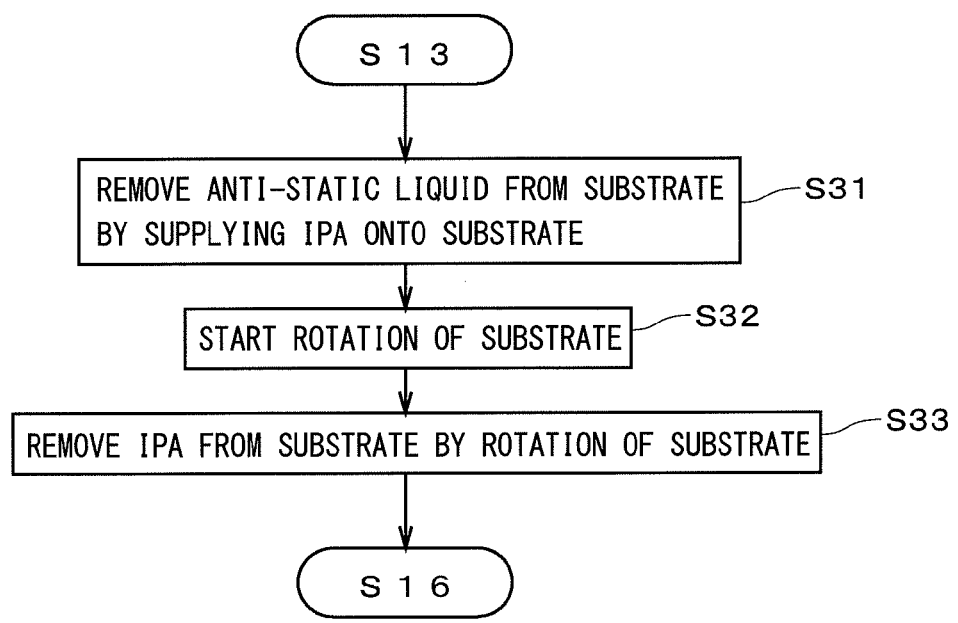
FIG. 6 is a flowchart showing a partial operation flow for processing a substrate.

FIG. 6 is a flowchart showing a partial operation flow for processing the substrate 9 in the substrate processing apparatus 1a. In the substrate processing apparatus 1a, after the same process steps as Steps S11 to S13 shown in FIG. 2 are performed, Steps S31 to S33 shown in FIG. 6 are performed and then Steps S16 to S20 shown in FIG. 2 are performed.

Specifically, first, the target electrical resistivity of the anti-static liquid is set by the electrical resistivity setting part 81 (see FIG. 1) on the basis of the size of the device formed on the substrate 9 and the like and stored in the control part 8 (Step S11). The anti-static liquid supply part 6 controls the ion concentration of the anti-static liquid on the basis of the output from the electrical resistivity meter 67 and the target electrical resistivity, to thereby bring the electrical resistivity of the anti-static liquid into the target electrical resistivity (Step S12). Then, the anti-static liquid is supplied onto the substrate 9 and the entire upper surface 91 of the substrate 9 is puddled with the anti-static liquid, and thus the static elimination process is performed (Step S13).

After the static elimination process for the substrate 9 is finished, the anti-static liquid nozzle rotating mechanism 68 rotates the anti-static liquid nozzle 65 to be moved from the position shown in FIG. 5 back to the waiting position outside the substrate 9. Further, the IPA nozzle rotating mechanism 74 moves the IPA nozzle 72 from the waiting position and as shown in FIG. 5, an outlet at a front end of the IPA nozzle 72 is directed to the center portion of the upper surface 91 of the substrate 9. Subsequently, the control part 8 opens the IPA valve 73 of the IPA supply part 7 and the IPA is thereby supplied onto the substrate 9. On the substrate 9, the anti-static liquid is moved toward the edge of the substrate 9 by the IPA supplied onto the center portion of the upper surface 91 and pushed out of the edge of the substrate 9, thereby being removed from the upper surface 91 of the substrate 9 (Step S31). Thus, the IPA supply part 7 serves as a liquid removing part for removing the liquid such as the anti-static liquid or the like on the substrate 9 from the upper surface 91 of the substrate 9 by replacing the liquid with the IPA.

After the removal of the anti-static liquid is finished, the IPA nozzle 72 is moved back to the waiting position, and the control part 8 controls the substrate rotating mechanism 5 to start rotating the substrate 9 (Step S32). Then, with the rotation of the substrate 9, the IPA on the upper surface 91 of the substrate 9 is moved toward the edge of the substrate 9 and scattered out of the edge of the substrate 9, thereby being removed from the substrate 9 (Step S33).

After the removal of the IPA is finished, the number of revolutions in the rotation of the substrate 9 by the substrate rotating mechanism 5 decreases to the number of revolutions in the SPM process. Further, the processing liquid nozzle rotating mechanism 35 shown in FIG. 1 starts rotation of the processing liquid nozzle 34 and the processing liquid nozzle 34 thereby repeats reciprocating motion between the center portion of the substrate 9 and the edge thereof. Then, the SPM liquid is supplied onto the upper surface 91 of the substrate 9 from the processing liquid nozzle 34 and the SPM process is performed on the substrate 9 (Step S16). The supply of the SPM liquid onto the substrate 9 may be started while the IPA remains on the substrate 9.

After the SPM process is finished, the hydrogen peroxide water is supplied onto the substrate 9 from the processing liquid nozzle 34 and the SPM liquid is removed from the substrate 9 (Step S17). After the hydrogen peroxide water supplying process is finished, the processing liquid nozzle 34 is moved back to the waiting position outside the substrate 9, and the rinse process for supplying the rinse liquid (deionized water) onto the upper surface 91 of the substrate 9 is performed, to thereby remove the hydrogen peroxide water from the substrate 9 (Step S18). Then, the number of revolutions of the substrate 9 is increased, and the drying process is performed, in which the rinse liquid remaining on the substrate 9 is removed with the rotation of the substrate 9 (Step S19). After that, the rotation of the substrate 9 is stopped (Step S20), and the substrate 9 is unloaded from the substrate processing apparatus 1a.

In the substrate processing apparatus 1a, like in the substrate processing apparatus 1 of FIG. 1, before the SPM process using the SPM liquid is performed, the anti-static liquid having electrical resistivity higher than that of the SPM liquid is supplied onto the substrate 9 which is electrically charged by the preprocessing such as dry etching, plasma CVD, or the like and the entire upper surface 91 of the substrate 9 is puddled with the anti-static liquid. From the entire upper surface 91 of the substrate 9, static electricity is thereby relatively gently removed. Then, the SPM process is performed on the substrate 9 after being subjected to the static elimination process, and it is therefore possible to prevent any damage to the device due to the movement of the electric charges, i.e., any damage to the substrate 9. Further, by controlling the anti-static liquid supply part 6 to maintain the electrical resistivity of the anti-static liquid at the target electrical resistivity, it is possible to increase the static elimination efficiency of the substrate 9 and shorten the time required for the static elimination process while causing no damage to the substrate 9.

In the substrate processing apparatus 1a, after the anti-static liquid used for the static elimination process is removed from the upper surface 91 of the substrate 9, the SPM liquid is supplied onto the substrate 9 and the SPM process is performed. It is thereby possible to prevent the above-discussed adverse effect such as heat shock due to the mixture of the anti-static liquid and the SPM liquid. Further, in Step S31, by supplying the IPA onto the substrate 9, it is possible to remove the anti-static liquid without rotating the substrate 9. When the substrate 9 is rotated to remove the anti-static liquid therefrom, if the width of wiring pattern in the device formed on the substrate 9 is small, there is a possibility of breaking the wiring pattern by the surface tension of the anti-static liquid. In the substrate processing apparatus 1a, as discussed above, since the anti-static liquid is removed from the substrate 9 by using the IPA having a surface tension lower than that of deionized water or the like and then the IPA is removed by the rotation of the substrate 9, it is possible to prevent the damage to the substrate 9 such as the break in the wiring pattern or the like in the removal of the anti-static liquid.

Further, since the substrate processing apparatus 1a comprises the substrate rotating mechanism 5 and the IPA supply part 7, one of the substrate rotating mechanism 5 and the IPA supply part 7 may be selected to be used as a liquid removing part in accordance with the size of the device formed on the substrate 9, or the like. In other words, in the substrate processing apparatus 1a, the substrate rotating mechanism 5 and the IPA supply part 7 comprise the liquid removing part.

Though the preferred embodiments of the present invention have been discussed above, the preferred embodiments allow various variations.

For example, the static elimination process in Step S13 may be performed with the substrate 9 being rotated only if the layer of the anti-static liquid on the substrate 9 can be maintained, not being broken. In other words, the rotation of the substrate 9 may be started before the static elimination process. Further, the target electrical resistivity of the anti-static liquid may be set on the basis of conditions (e.g., the kind(s) of process(es) performed on the substrate before the loading of the substrate into the substrate processing apparatus) other than the size of the device.

In the substrate processing apparatuses 1 and 1a, an air knife for injecting sheet-like air toward the upper surface 91 of the substrate 9 to scatter and remove the liquid from the substrate 9 may be provided as a liquid removing part.

In the substrate processing apparatuses 1 and 1a, in Step S16, a processing liquid other than the SPM liquid may be supplied onto the substrate 9 to thereby perform other process on the substrate 9. For example, buffered hydrofluoric acid (BHF) may be supplied as the processing liquid onto the substrate 9 with the resist film formed thereon, to thereby perform an etching process on the substrate 9. In the substrate processing apparatuses 1 and 1a, as discussed above, since it is possible to prevent any damage to the substrate 9 due to the rapid movement of the electric charges caused by the contact between the electrically charged substrate 9 and the processing liquid, the constitution of the substrate processing apparatus 1 (1a) is particularly suitable for an apparatus for performing a processing using a process liquid having very low electrical resistivity, such as the SPM liquid or the buffered hydrofluoric acid.

The ionic liquid used as the anti-static liquid is not limited to a solution in which carbon dioxide is dissolved in deionized water. For example, a solution in which ammonia is dissolved in deionized water or a solution in which a very small amount of dilute hydrochloric acid is added to deionized water may be used as the anti-static liquid, and liquid containing other various ions may be used as the anti-static liquid. Further, the anti-static liquid is not limited to the ionic liquid or deionized water but various kinds of liquid may be used as the anti-static liquid only if the electrical resistivity of the liquids is higher than that of the processing liquid.

In the substrate processing apparatuses 1 and 1a, only if the static elimination process is performed by using an anti-static liquid having electrical resistivity higher than that of the processing liquid, it is not always necessary to maintain the electrical resistivity of the anti-static liquid at the target electrical resistivity. In this case, the electrical resistivity setting part 81 may be omitted.

If the mixture of the anti-static liquid and the processing liquid causes no adverse effect, there may be a case where the process step of removing the anti-static liquid (Steps S15 and S31) is omitted and the processing liquid is supplied to thereby perform the process of the substrate 9 with the anti-static liquid remaining on the upper surface 91 of the substrate 9.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2011-215258 filed in the Japan Patent Office on Sep. 29, 2011 and Japanese Patent Application No. 2011-215260 filed in the Japan Patent Office on Sep. 29, 2011, the entire disclosures of which are incorporated herein by reference.

REFERENCE SIGNS LIST 1, 1a substrate processing apparatus
2 substrate holding part
3 processing liquid supply part
5 substrate rotating mechanism
6 anti-static liquid supply part
7 IPA supply part
8 control part
9 substrate
81 electrical resistivity setting part
91 upper surface
S11 to S20, S31 to S33 step

The invention claimed is:

1. A substrate processing apparatus for processing a substrate, comprising:
a substrate holding part for holding a substrate with a main surface thereof directed upward;
a processing liquid supply part for supplying a processing liquid onto said main surface of said substrate on which a device has been formed in advance;
an anti-static liquid supply part for supplying an anti-static liquid having electrical resistivity higher than that of said processing liquid onto said main surface of said substrate from an anti-static liquid nozzle positioned above said main surface of said substrate;
a liquid removing part for removing a liquid from said main surface of said substrate; and
a control part configured to control said processing liquid supply part, said anti-static liquid supply part, and said liquid removing part to supply said anti-static liquid onto said main surface of said substrate to thereby puddle entire said main surface of said substrate with said anti-static liquid, and to then remove said anti-static liquid from said main surface and further supply said processing liquid onto said main surface of said substrate to thereby perform a process.

2. The substrate processing apparatus according to claim 1, wherein
said liquid removing part comprises a substrate rotating mechanism for rotating said substrate together with said substrate holding part about a rotation axis which goes through a center of said substrate and is perpendicular to said main surface of said substrate to thereby remove a liquid from said main surface.

3. The substrate processing apparatus according to claim 2, wherein
a puddle process is performed on entire said main surface of said substrate with said anti-static liquid while said substrate rotating mechanism stops or rotates said substrate at a rotating speed lower than that of said substrate in removing said liquid from said main surface.

4. The substrate processing apparatus according to claim 1, wherein
said liquid removing part comprises an IPA supply part for supplying liquid isopropyl alcohol onto said main surface of said substrate to push a liquid on said main surface out of an edge of said substrate, to thereby remove said liquid from said main surface of said substrate.

5. The substrate processing apparatus according to claim 1, wherein
said processing liquid is an SPM liquid in which sulfuric acid which is heated and hydrogen peroxide water are mixed, and
said process is an SPM process.

6. The substrate processing apparatus according to claim 1, wherein
said processing liquid is an buffered hydrofluoric acid, and
said process is an etching process.

7. The substrate processing apparatus according to claim 1, further comprising:
an electrical resistivity setting part for setting target electrical resistivity of said anti-static liquid,
wherein said anti-static liquid is an ionic liquid or deionized water, and
with control by said control part, a puddle process is performed on entire said main surface of said substrate with said anti-static liquid while the ion concentration of said anti-static liquid is controlled to maintain the electrical resistivity of said anti-static liquid at said target electrical resistivity.

8. The substrate processing apparatus according to claim 7, wherein
said target electrical resistivity set in said electrical resistivity setting part becomes higher as the size of said device becomes smaller.

9. The substrate processing apparatus according to claim 7, wherein
said anti-static liquid is said ionic liquid, and
said ionic liquid is a solution in which carbon dioxide is dissolved in deionized water.

10. The substrate processing apparatus according to claim 9, wherein
said control part controls the amount of carbon dioxide to be dissolved in said deionized water to thereby maintain the electrical resistivity of said anti-static liquid at said target electrical resistivity.

11. The substrate processing apparatus according to claim 1, wherein
said anti-static liquid is a solution in which ammonia is dissolved in deionized water or a solution in which a dilute hydrochloric acid is added to deionized water.

12. The substrate processing apparatus according to claim 1, wherein
said anti-static liquid supply part supplies said anti-static liquid onto said main surface of said substrate, after said substrate has been subjected to a drying process and thereby electrically charged in advance before being loaded into said substrate processing apparatus.

13. The substrate processing apparatus according to claim 1, wherein
said liquid removing part comprises at least one of
a substrate rotating mechanism for rotating said substrate together with said substrate holding part about a rotation axis which goes through a center of said substrate and is perpendicular to said main surface of said substrate to thereby remove a liquid from said main surface;
an IPA supply part for supplying liquid isopropyl alcohol onto said main surface of said substrate to push a liquid on said main surface past an edge of said substrate, to thereby remove said liquid from said main surface of said substrate; and
an air knife for injecting a sheet of air toward said main surface of said substrate to thereby scatter and remove a liquid from said substrate.

14. The substrate processing apparatus according to claim 1, wherein said control part is a programmed computer.

* * * * *